United States Patent
Okuya

(10) Patent No.: US 7,916,489 B2
(45) Date of Patent: Mar. 29, 2011

(54) MOUNTING STRUCTURE

(75) Inventor: Hisayoshi Okuya, Nishio (JP)

(73) Assignee: Aisin Seiki Kabushiki Kaisha, Kariya-Shi, Aichi-Ken (JP)

( * ) Notice: Subject to any disclaimer, the term of this patent is extended or adjusted under 35 U.S.C. 154(b) by 787 days.

(21) Appl. No.: 11/936,013

(22) Filed: Nov. 6, 2007

(65) Prior Publication Data

US 2008/0106873 A1   May 8, 2008

(30) Foreign Application Priority Data

Nov. 8, 2006   (JP) .................................. 2006-302833

(51) Int. Cl.
*H05K 5/00* (2006.01)
(52) U.S. Cl. .................... 361/752; 361/730; 361/800
(58) Field of Classification Search .................. 361/807, 361/810, 752, 730, 790, 797, 800
See application file for complete search history.

(56) References Cited

U.S. PATENT DOCUMENTS

| | | | | |
|---|---|---|---|---|
| 6,050,845 A | * | 4/2000 | Smalley et al. | 439/417 |
| 6,068,494 A | * | 5/2000 | Tokuwa | 439/79 |
| 6,252,394 B1 | * | 6/2001 | Roze et al. | 324/207.12 |
| 6,657,869 B1 | * | 12/2003 | Linke et al. | 361/752 |
| 7,144,258 B2 | | 12/2006 | Ariga et al. | |
| 7,245,498 B2 | * | 7/2007 | Togami et al. | 361/753 |

FOREIGN PATENT DOCUMENTS

JP   2005-101088 A   4/2005

* cited by examiner

*Primary Examiner* — Hung S Bui
(74) *Attorney, Agent, or Firm* — Buchanan Ingersoll & Rooney PC

(57) ABSTRACT

According to an aspect of the present invention, a mounting structure includes a housing, an electronic component mounted at the housing, a pin-shaped terminal arranged upright at the housing, a circuit board having a mounting through-hole into which the in-shaped terminal is inserted, and a mounting support member positioned between the housing and the circuit board and fixed to the housing with the circuit board. In the mounting structure, the mounting support member includes a through-hole for positioning the pin-shaped terminal and an inclined guiding surface formed continuously with the through-hole for guiding a distal end of the pin-shaped terminal into the through-hole.

20 Claims, 11 Drawing Sheets

For right-hand-drive vehicle

Operating range (70°)

For left-hand-drive vehicle

Operating range (70°)

For right-hand-drive vehicle

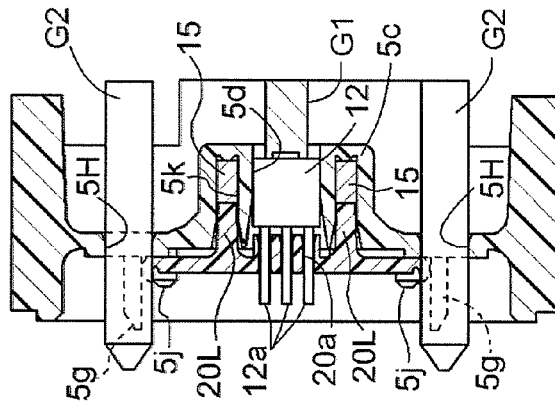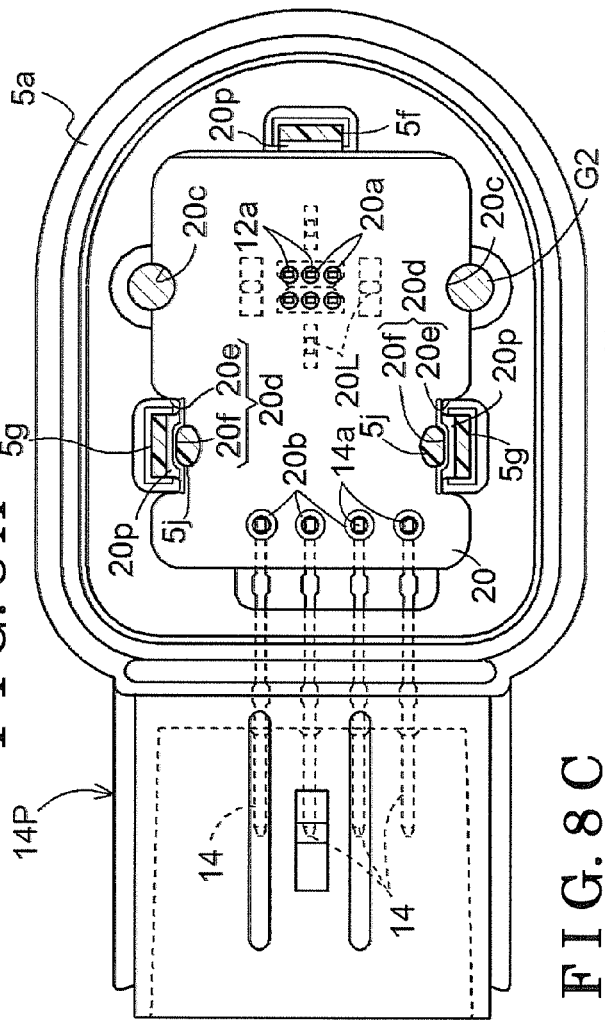

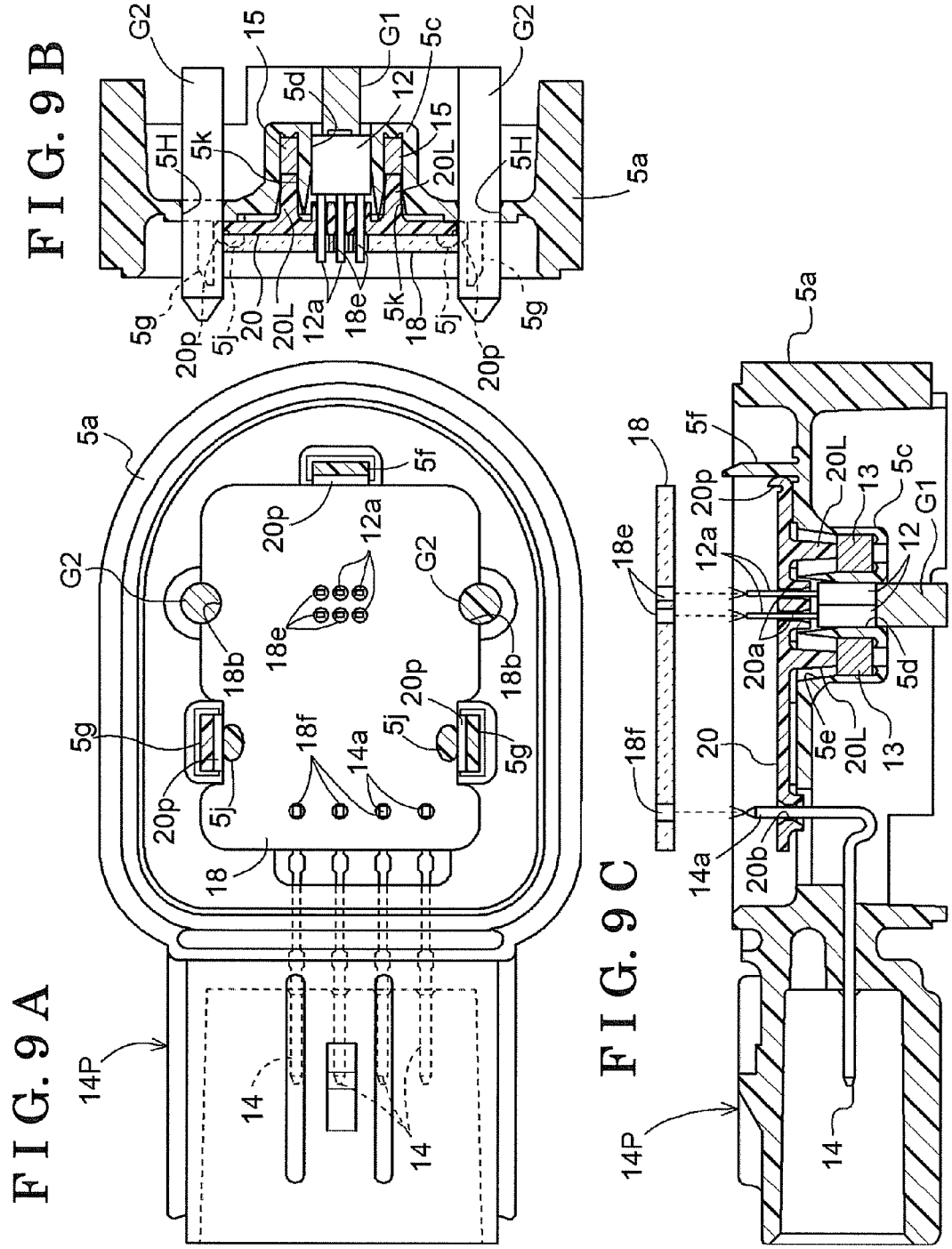

For right-hand-drive vehicle

Operating range (70°)

For left-hand-drive vehicle

Operating range (70°)

MOUNTING STRUCTURE

CROSS REFERENCE TO RELATED APPLICATIONS

This application is based on and claims priority under 35 U.S.C. §119 to Japanese Patent Application 2006-302833, filed on Nov. 8, 2006, the entire content of which is incorporated herein by reference.

FIELD OF THE INVENTION

The present invention relates to a mounting structure including a housing, electronic component mounted in the housing, and a circuit board provided with through-holes into which pin-shaped terminals arranged upright at the housing.

BACKGROUND

This type of a mounting structure disclosed in JP2005-101088A (Section 0019, FIGS. 1 and 3) hereinafter referred to Reference 1 includes a circuit board provided with through-holes each having a small diameter and a plurality of connector terminals leaving a narrow distance from each other. Pin-shaped terminals of the connector terminals are inserted into the through-holes respectively so as to be mounted at the printed circuit board.

However, in the mounting structure disclosed in Reference 1, the pin-shaped terminals are required to be respectively inserted into the small diameter of each of the through-holes on the circuit board at the same time. Accordingly, when a distal end of each of the pin-shaped terminals of the connector terminals is dislocated from the original alignment position, it becomes difficult to insert the pin-shaped terminals into the through-holes respectively. Consequently, especially in the case of a plurality of pin-shaped terminals having a plurality of rows, an expensive tool with a very complicated structure must be prepared in order to achieve an automated mounting.

A need thus exists for a mounting structure, which is not susceptible to the drawback mentioned above.

SUMMARY OF THE INVENTION

According to an aspect of the present invention, a mounting structure includes a housing, an electronic component mounted at the housing, a pin-shaped terminal arranged upright at the housing, a circuit board having a mounting through-hole into which the in-shaped terminal is inserted, and a mounting support member positioned between the housing and the circuit board and fixed to the housing with the circuit board. Furthermore, in the mounting structure, the mounting support member includes a through-hole for positioning the pin-shaped terminal and an inclined guiding surface formed continuously with the through-hole for guiding a distal end of the pin-shaped terminal into the through-hole.

BRIEF DESCRIPTION OF THE DRAWINGS

The foregoing and additional features and characteristics of the present invention will become more apparent from the following detailed description considered with reference to the accompanying drawings, wherein:

FIG. 8 is a trihedral figure illustrating a process for manufacturing the detection-side housing;

FIG. 9 is a trihedral figure illustrating a process for manufacturing the detection-side housing;

DETAILED DESCRIPTION

Figure 1:
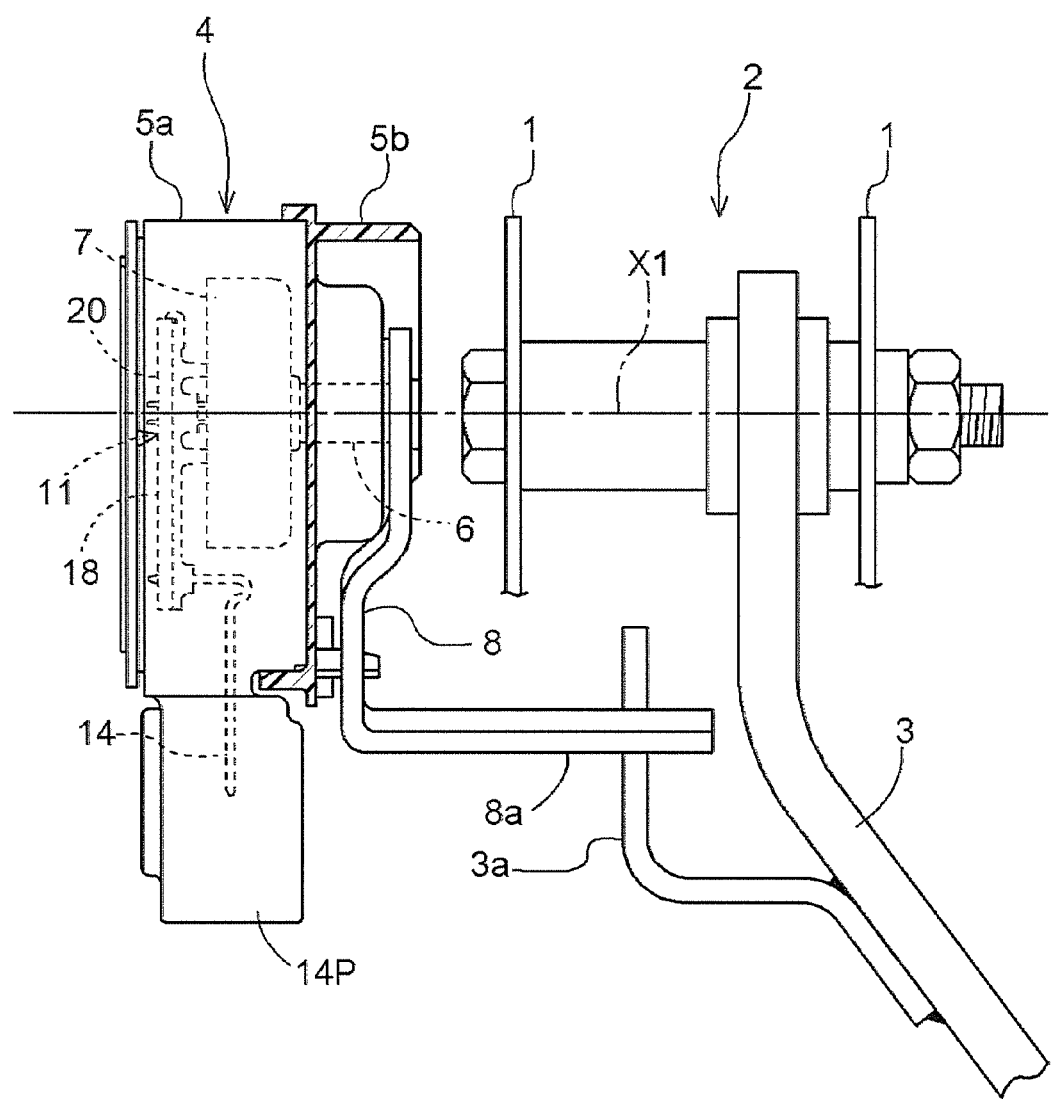
FIG. 1 is a schematic view illustrating an operating pedal unit provided with a rotation angle detection device according to an embodiment of the present invention.

An embodiment of the present invention will be explained with reference to the illustrations of the drawing figures as follows. Directions upward, downward, right, left, forward and rearward described below are based upon the view in FIG. 6.

Figure 2:
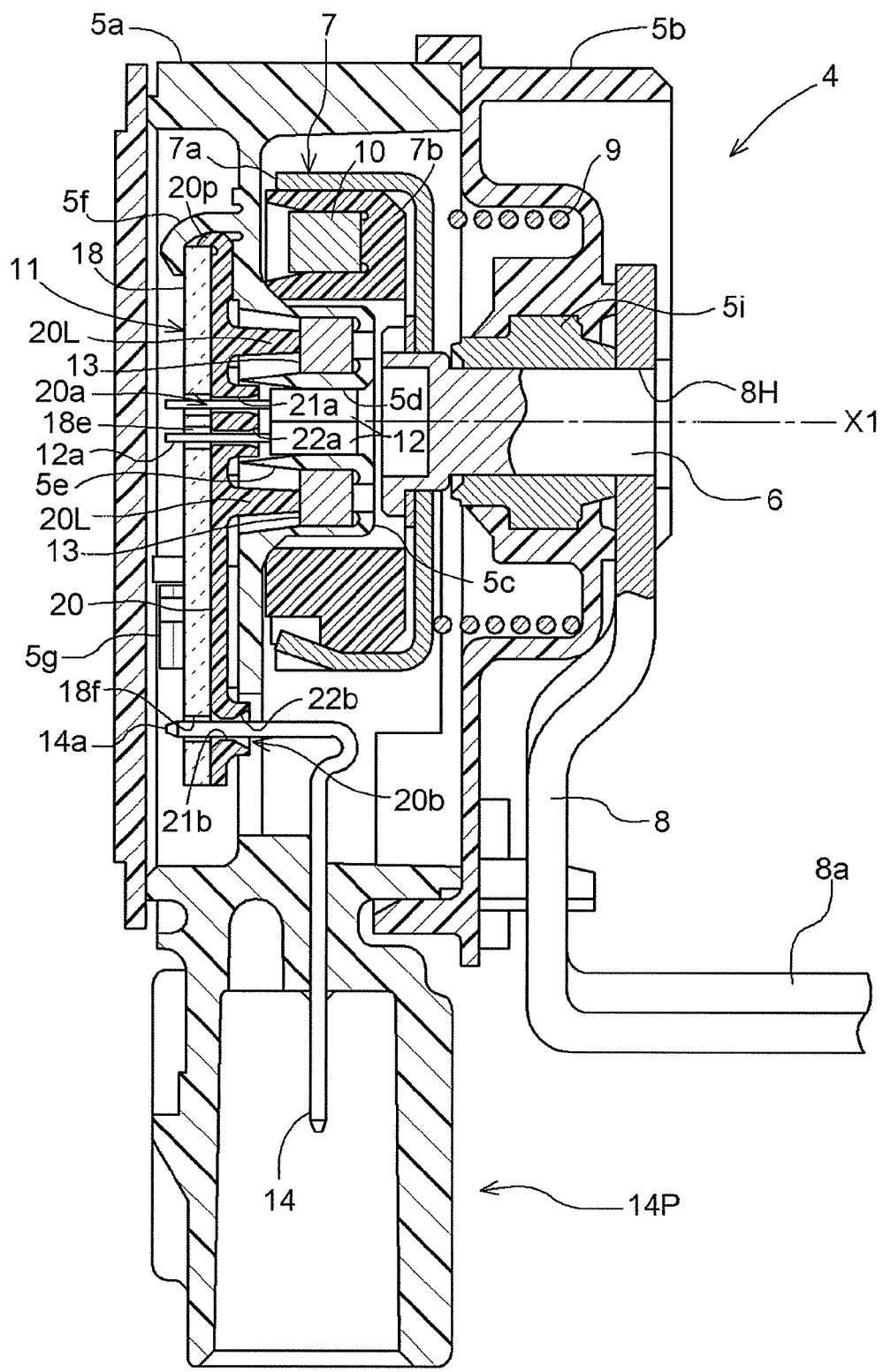
FIG. 2 is a cutaway front view illustrating a main part of the rotation angle detection device illustrated in FIG. 1.
Figure 3A:
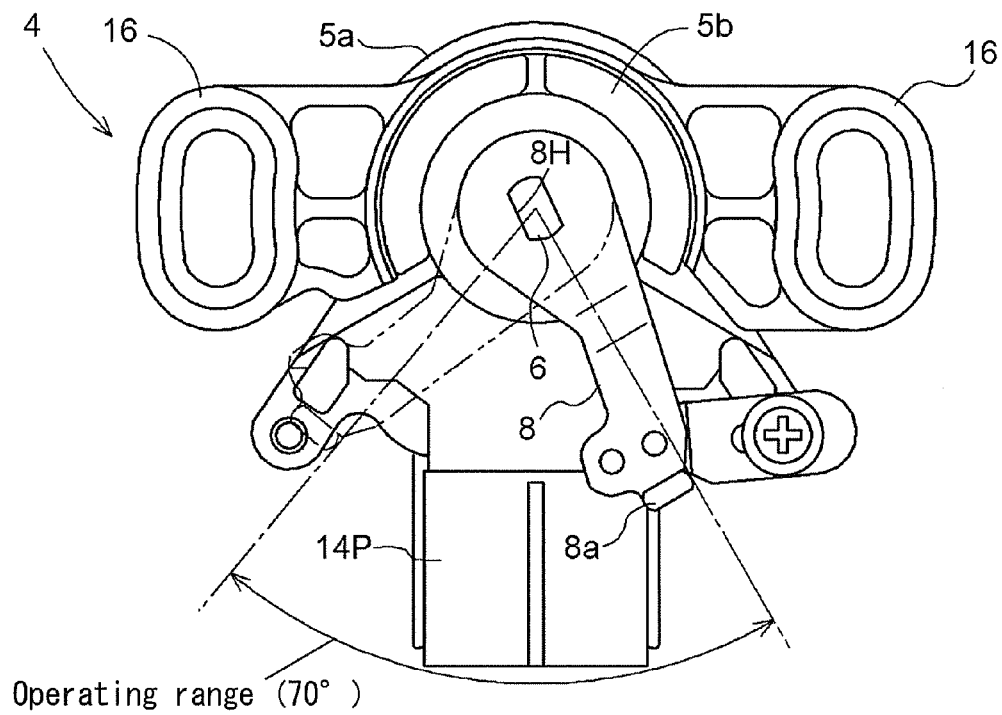
FIG. 3 is a lateral view illustrating the rotation angle detection device.
Figure 3B:
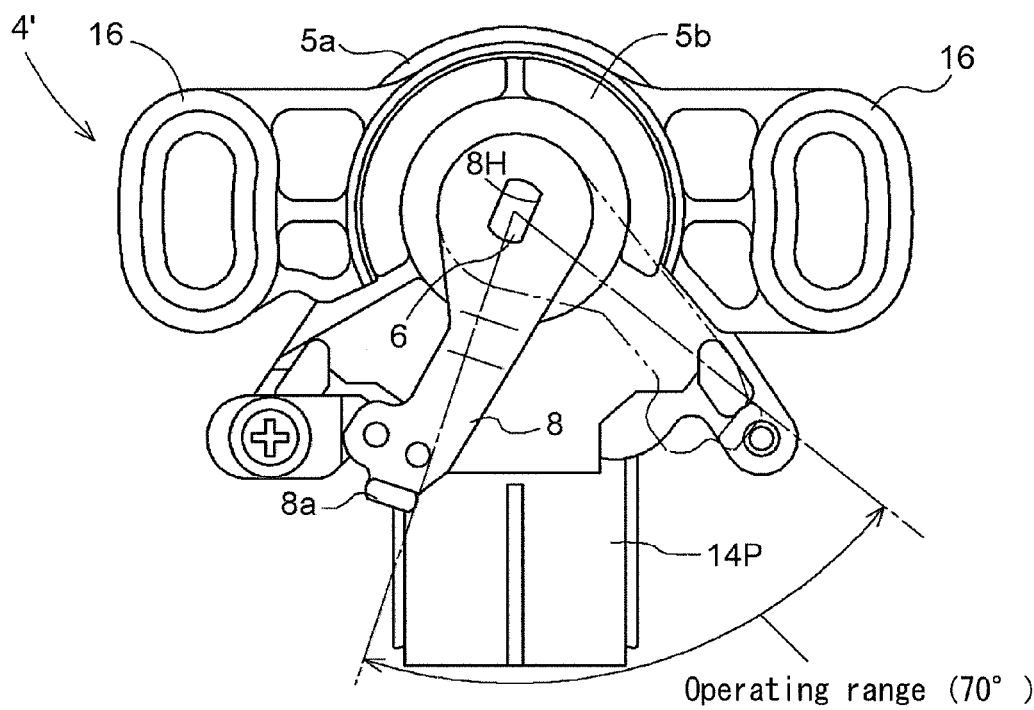

FIGS. 1 through 3 are schematic views each illustrating an operating pedal unit 2 for a brake pedal or the like mounted to a vehicle. FIG. 1 is a front view illustrating a rotation angle detection device 4 included in the operating pedal unit 2. FIG. 2 is a cross sectional view illustrating a main part of the rotation angle detection device 4 illustrated in FIG. 1. FIG. 3A is a lateral view illustrating the operating pedal unit 2 for a right-hand-drive vehicle. FIG. 3B is a lateral view illustrating the operating pedal unit 2 for a left-hand-drive vehicle. As illustrated in FIG. 1, the operating pedal unit 2 includes a pedal arm 3 rotatably supported around a shaft center X1 by brackets 1 projecting from a vehicle body. The operating pedal unit 2 further includes the rotation angle detection device 4 for detecting a rotation angle of the pedal arm 3 when a driver operates the pedal arm 3. A pedal lever 3a extends from the pedal arm 3.

As illustrated in FIG. 2, the rotation angle detection device 4 includes a detection-side housing 5a and an operation-side housing 5b covering the opening of the detection-side housing 5a. A shaft 6 is pivotally supported in the operation-side housing 5b. The shaft 6 is rotatably operated in accordance with rotation of the pedal arm 3. A cup-shaped rotor 7 (also referred to as a tubular yoke) is supported at one end of the shaft 6 so as to integrally rotate with the shaft 6. Meanwhile, a magnetic sensing unit 11 for detecting a rotation angle of the rotor 7 is arranged at the detection-side housing 5a.

A base end side of a sensor lever 8 extends radially from the operation-side housing 5b. The base end of the sensor lever 8 is fixed to a non-circular section of the other end of the shaft 6 by spin staking or other fixing methods so as not to relatively rotate with each other. A bended end portion 8a of the sensor lever 8 is constantly pressed against the pedal lever 3a of the pedal arm 3 by a return spring 9 without relation to operation of the pedal arm 3.

Figure 4:
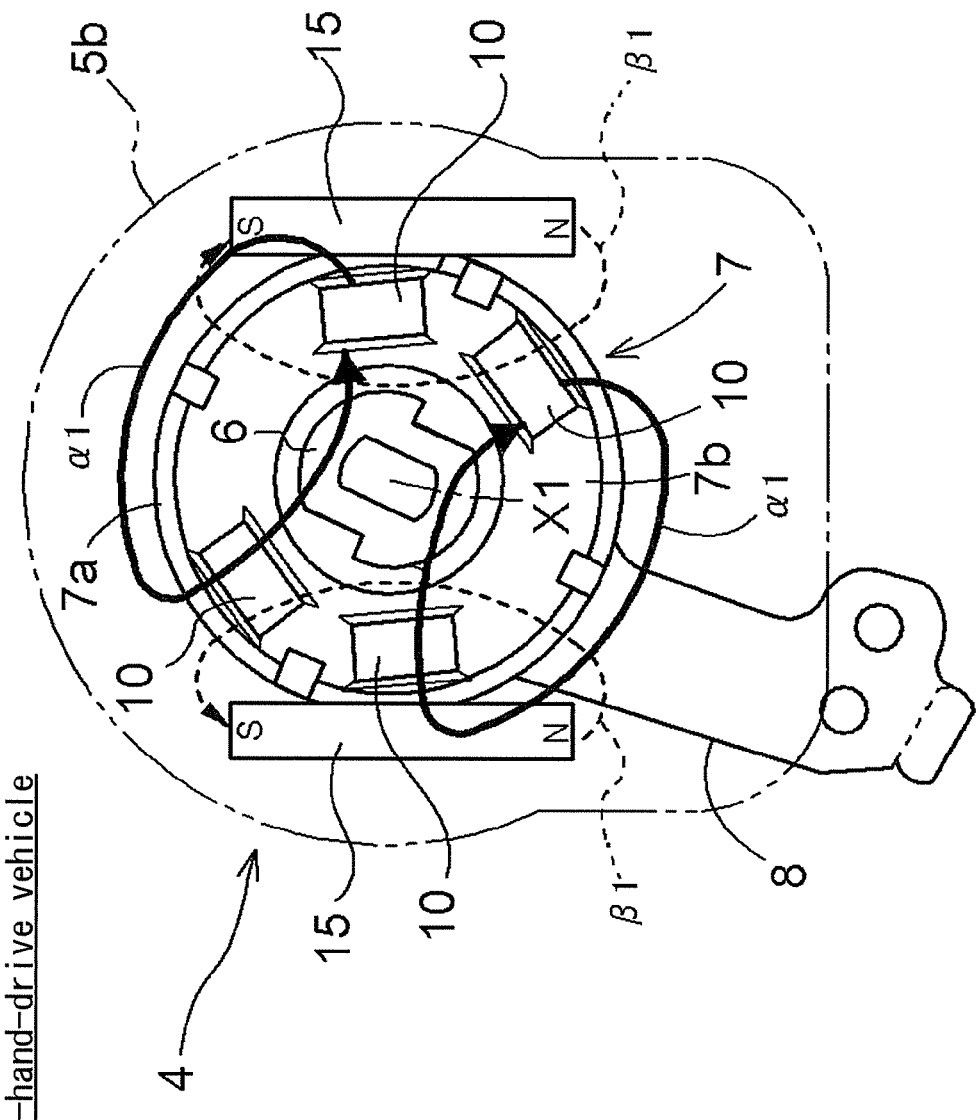
FIG. 4 is a schematic back view illustrating an internal portion of an operation-side housing (for a right-hand-drive vehicle)

FIG. 4 is a back view illustrating an internal portion of the operation-side housing 5b taken from the shaft center direction under the condition where the pedal arm 3 is not operated and the sensor lever 8 is positioned at the original point in the rotation angle detection device 4 for the right-hand-drive vehicle. As illustrated in FIG. 4, two pairs of rotor magnets 10 of permanent magnets are fixed in the inner side of the rotor 7. Meanwhile, as illustrated in FIG. 2, the magnetic sensing unit 11 at the detection-side housing 5a includes two hall elements 12 (an example of electronic components) facing the rotor magnets 10 and arranged so as to readily detect magnetic fluxes heading in upward and downward directions illustrated in FIG. 4. The magnetic sensing unit 11 further includes a condenser (not shown) for removing noise, magnetic yoke members 13 for compensating the magnetic flux generated by the rotor magnets 10, near the hall elements 12, and or the like. A connector portion 14P for selecting output signals from the hall elements 12 is provided at the detection-side housing 5a.

A pair of bias magnets 15 is fixed to right and left sides of the outer periphery of the rotor 7 in a crosswise direction as illustrated in FIG. 4. When the sensor lever 8 is positioned at the original point, the pair of the bias magnets 15 functions to offset the magnetic flux generated by the rotor magnets 10, near the hall elements 12 so that the magnetic flux does not substantively affect the hall elements 12. Two magnetic fluxes $\alpha 1$, $\alpha 1$ (indicated by full lines) are generated from the magnetic rotors 10. Each of the magnetic flux $\alpha 1$ has a magnetic flux component heading in a downward direction illustrated in FIG. 4, near the hall elements 12. Each of the bias magnets 15 includes a south pole at its upper end and a north pole at its lower end. The magnetic flux $\beta 1$ (indicated by dash lines) of each of the bias magnets 15 includes a magnetic flux component heading in an upward direction illustrated in FIG. 4, which offsets the downward magnetic flux generated by the magnetic rotors 10.

When a driver presses a brake pedal, the pedal arm 3 is rotatably operated. Accordingly, the sensor lever 8 and the shaft 6 are integrally rotated with each other depending on the rotation amount of the pedal arm 3 within the range indicated by an arc arrow at the lower side of FIG. 3A, from the original point indicated by a full line to the maximum operative point indicated by a chain double-dashed line. According to the rotating operation, the rotor 7 is rotatably operated. Since magnetic flux density affecting the hall elements 12 and a voltage signal outputted from the hall elements 12 vary based on the rotating operation of the rotor 7, the rotation amount of the sensor lever 8 is determined by outputting voltage signals via connector pins 14 of the connector portion 14P and thereby computing the outputted signals.

When the sensor lever 8 is positioned at the original point, the magnetic flux density affecting the hall elements 12 is zeroed by the bias magnets 15. In other words, the original point of the sensor lever 8 having the bias magnets 15 is shifted from the original point of the sensor lever 8 having without the bias magnet 15 to a negative side by an amount of a predetermined rotation angle of the rotor 7, thereby linearly increasing a region where magnetic flux density is detected. Consequently, the rotational operation of the sensor 8 is precisely detected in a rotational operating range of approximately 70 degrees wider than the rotational operating range of the sensor lever 8 without the bias magnets 15.

In particular, the detection-side housing 5a and the operation-side housing 5b are made of plastic. Both of the detection-side housing 5a and the operation-side housing 5b are firmly attached to each other by laser welding when the rotation angle detection device 4 is completed. As illustrated in FIG. 2, the detection-side housing 5a includes a boss portion 5c formed to protrude into an opposite direction from the center part of the surface where the shaft 6 is inserted. The boss portion 5c has the bottom portion facing the center part of the surface of the detection-side housing 5a. The boss portion 5c includes two hollow cylinder-shaped portions each having a closed end at the bottom portion of the boss portion. Two hall elements 12 are accommodated in the boss 5c. The shaft 6 is pivotally supported at a cylindrical bearing 5i formed near the center of the operation-side housing 5b.

As illustrated in FIG. 3, the rotation angle detection device 4 is fixed with screws on the vehicle body (both of which are not shown) via a pair of mounting stays 16 extending into opposite directions with each other from the operation-side housing 5b. As illustrated in FIG. 4, the rotor 7 includes a cup-shaped yoke body 7a made of magnetic material such as iron or nickel alloy and a magnetic holder 7b made of non-magnetic material such as plastic fixed in the inner peripheral surface of the yoke body 7a. The rotor magnets 10 are accommodated and supported within the magnetic holder 7b. The yoke body 7a accommodating the rotor magnets 10 constructs a type of magnetic circuits.

The detection-side housing 5a includes a printed circuit board 18 (hereinafter referred to as PCB 18) for mounting the hall elements 12. An alignment plate 20 (an example of a mounting support member) is interposed between the detection-side housing 5a and the PCB 18 for easily inserting the hall elements 12 and pin-shaped terminals 14a of the connector pins 14 into small mounting through-holes on the PCB 18.

A manufacturing method of the detection-side housing 5a will be explained below with reference to FIGS. 6 to 10. Specially, a mounting structure for mounting the hall elements 12 and the connector pins 14, which are arranged at the detection-side housing 5a, to the PCB 18 will be mainly described. Although the detection-side housing 5a prepared in a previous process is not described in detail here, four of the connector pins 14 have already been inserted into and fixed to the detection-side housing 5a. However, the PCB 18 has not been mounted to the detection-side housing 5a yet.

The mounting structure according to the embodiment is mainly characterized in that the alignment plate 20 described above is applied for mounting the hall elements 12 and the connector pins 14 before mounting the PCB 18 to the detection-side housing 5a.

Figure 6:
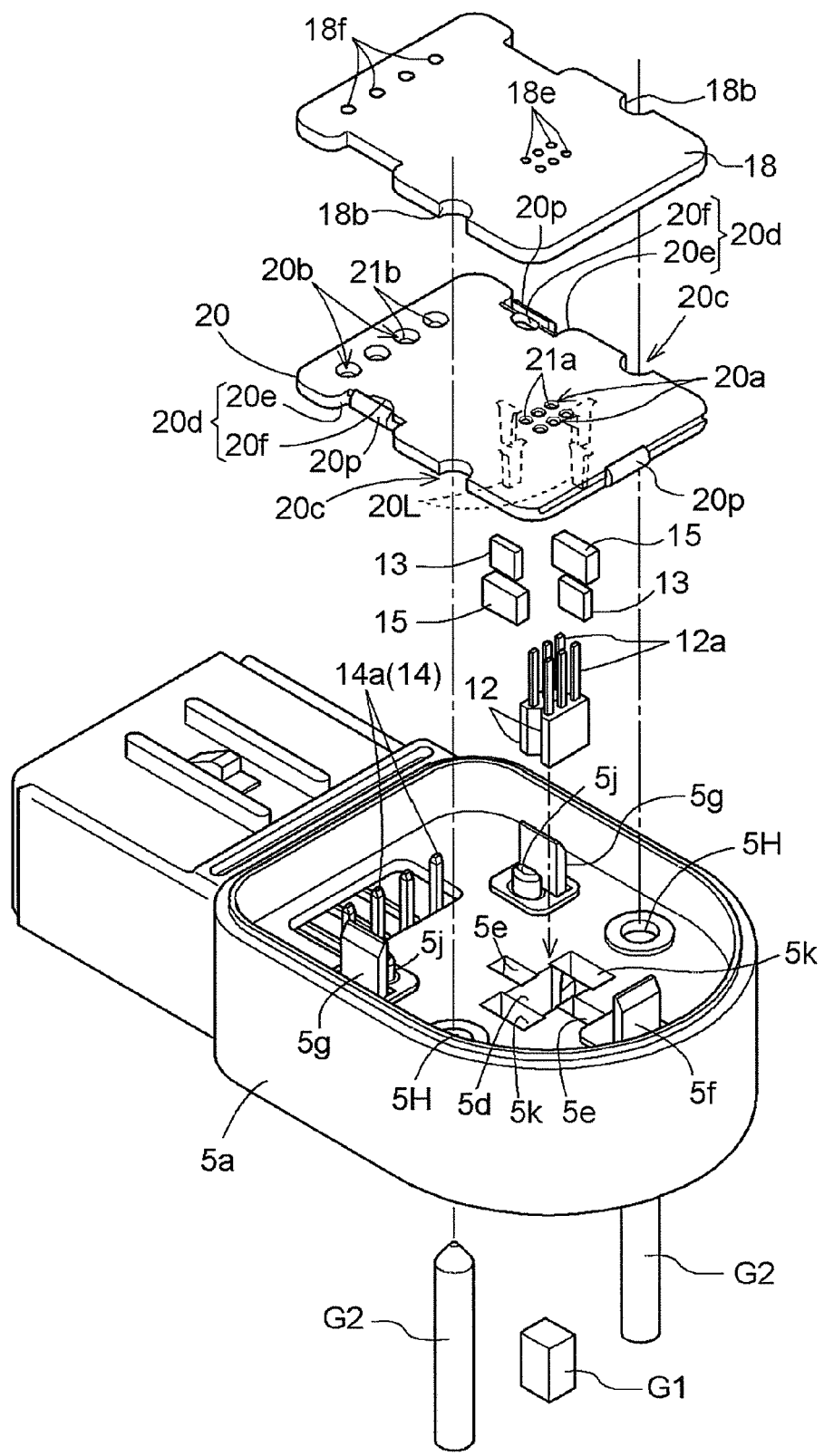
FIG. 6 is an exploded perspective view illustrating a detection-side housing.

As illustrated in FIG. 6, the alignment plate 20 is formed from an approximately plate-like member made of plastic. Six first alignment holes 20a (an example of through-holes) for inserting the total number of six pin-shaped terminals 12a of the two hall elements 12 are formed on the plate-like member body of the alignment plate 20. Four of second alignment holes 20b (an example of through-holes) for inserting the connector pins 14a of the four of the connector pins 14 are also formed on the plate like body of the alignment plate 20.

The PCB 18 is a planar shaped member that has not surface roughness and is made of glass epoxy or the like. The PCB 18 is formed with a printed circuit at least on the upper surface of the PCB 18 illustrated in FIG. 6. The PCB 18 includes six mounting through-holes 18e in position for mounting the two hall elements 12 at corresponding positions of the printed circuit. The PCB 18 further includes four mounting through-holes 18f in position for mounting the four of the connector pins 14 at corresponding positions of the printed circuit.

As illustrated in FIG. 8 described hereinafter, through-holes 21a are formed in the first alignment holes 20a for the hall elements 12 respectively. The through-holes 21a include throttle portions 21a extending along the inserting direction of the pin-shaped terminal respectively. Each of the throttle portions 21a has a slightly larger internal diameter than the external diameter of each of the pin-shaped terminals 12a of the hall elements 12. More specifically, the throttle portion 21a positions the pin-shaped terminal 12a so as to orient the pin-shaped terminal 12a in an appropriate direction and to be placed at an appropriate position without being inclined. Inclined guiding surfaces 22a are formed continuously with the throttle-portion 21a (through-hole 21a) in the lower half of the first alignment holes 20a respectively. Each of the inclined guiding surfaces 22a extends downward from the throttle portion 21a and is gradually expanded radially outwardly.

Through-holes 21b are formed in the second alignment holes 20b for the connector pins 14a respectively. The through-holes 21b include throttle portions 21b extending along the inserting direction of the pin-shaped terminal respectively. Each of the throttle portions 21b has a slightly larger inner diameter than the external diameter of each of the pin-shaped terminals 14a of the connectors 14. More specially, the throttle portion 21b positions the pin-shaped terminal 14a so as to orient the pin-shaped terminal 14a in an appropriate direction and to be placed at an appropriate position without being inclined. Inclined guiding surfaces 22b are formed continuously with the though-hole 21b (the through-hole 21b) in the lower half of the second alignment holes 20b respectively. Each of the inclined guiding surfaces 22b extends downward from the throttle portion 21b and is gradually expanded radially outwardly.

As illustrated in FIG. 6, semicircular positioning recessed portions 20c are formed at both sides of the alignment plate 20. The positioning recessed portions 20c are engaged with circular side surfaces of two of second pin-shaped mounting tools G2 respectively, thereby positioning the mounting member 20 relative to the PCB 18. Four retaining leg portions 20L for retaining the magnetic yoke members 13 and the bias magnets 15 are arranged vertically downwardly from the lower surface of the alignment plate 20 illustrated in FIG. 6.

Figure 7A:
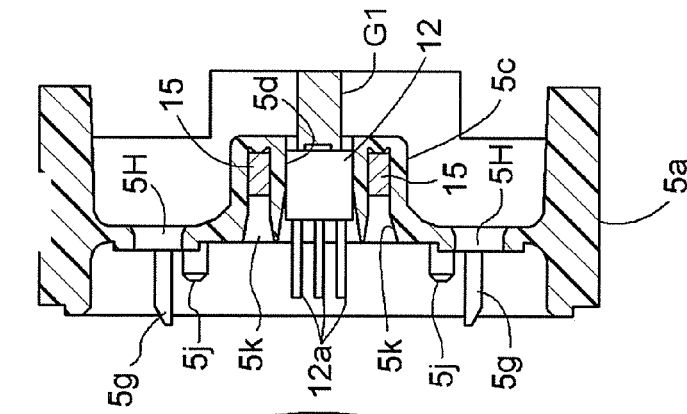
FIG. 7 is a trihedral figure illustrating a process for manufacturing the detection-side housing.
Figure 7B:
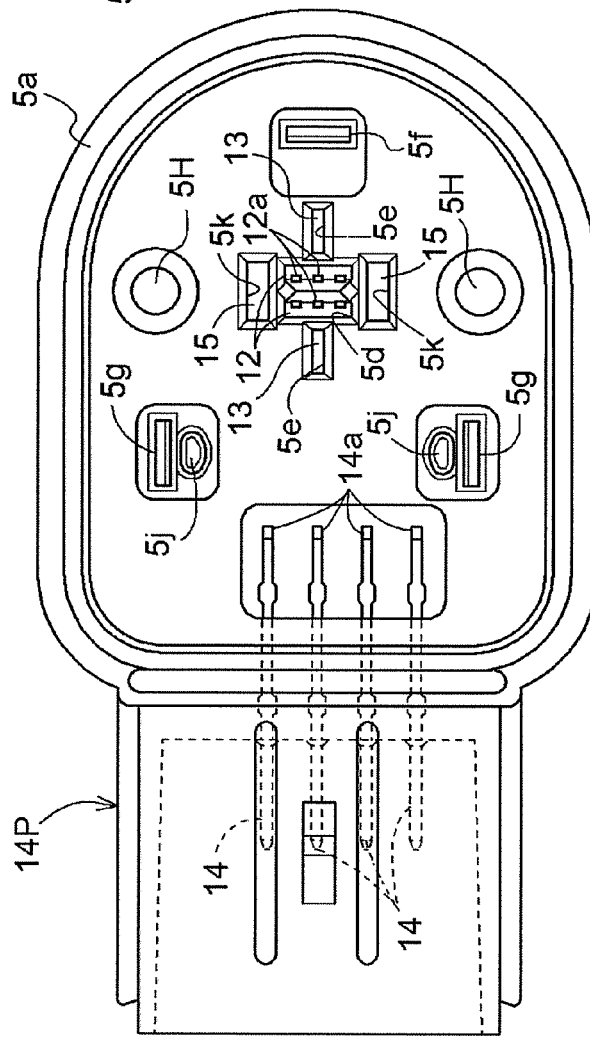
Figure 7C:
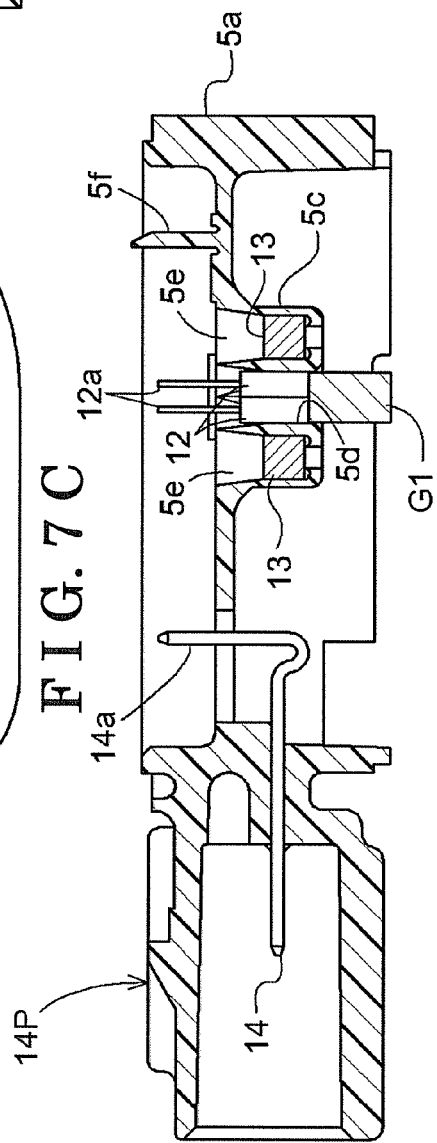

A first mounting process will be described below. As illustrated in FIGS. 6 and 7, the two hall elements 12 are vertically inserted into an element storage recess 5d formed in the boss 5c of the detection-side housing 5a from the lower side of the detection-side housing 5a as seen in FIG. 7. When the two hall elements 12 are inserted as aforementioned, the pin-shaped terminals 12 head upwardly in FIG. 7. Preferably, a first pin-shaped mounting tool G1 for positioning the height of the hall elements 12 is vertically inserted into the element storage recess 5d from the lower side of the detection-side housing 5a before inserting the hall elements 12 into the element storage recess 5d. Two yoke storage grooves and two magnet storage grooves 5k are formed in the boss 5c. Two of the magnetic yoke members 13 are inserted into the two yoke storage grooves 5e respectively from a downwardly direction. Two of the bias magnets 15 are inserted into the bias magnet storage grooves 5k respectively from a downwardly direction.

A second mounting process will be explained below. As illustrated in FIG. 8, two positioning through-holes 5H are formed in the detection-side housing 5a. The two of the second pin-shaped mounting tools G2 are inserted into the positioning through-holes 5H respectively from a downwardly direction. Next, a sheet of the alignment plate 20 is mounted to the detection-side housing 5a from an upward direction.

In particular, after the positioning recessed portions 20c are engaged with the ends of the two of the second pin-shaped mounting tools G2, the alignment plate 20 is moved downwardly in the vertical lower direction toward the detection-side housing 5a. Therefore, the total of the six pin-shaped terminals 12a of the two hall elements 12 are first inserted into the inclined guiding surfaces 22a of the first alignment holes 20a respectively. At the same time, the total number of the four pin-shaped terminals 14a of the connector pins 14 are automatically inserted into the inclined guiding surfaces 22b of the second alignment holes 20b respectively. Afterward, when the alignment plate 20 is further moved downwardly toward the detection-side housing 5a, the total of the six pin-shaped terminals 12a of the two hall elements 12 are inserted into the throttle portions 21a each having the small diameter. At the same time, the total of the four pin-shaped terminals 14a of the four connector pins 14 are inserted into the throttle portions 21b having the small diameter. Afterward, the alignment plate 20 is moved downwardly until the lower surface of the alignment plate 20 is contact with a supporting area defined above the detection-side housing 5a.

In addition, when the alignment plate 20 is moved downwardly, the height of each of the second pin-shaped mounting tools G2 should be established long so that the positioning recessed portions 20c of the alignment plate 20 are respectively engaged with one of the ends of the second pin-shaped mounting tools G2 before the pin-shaped terminals 12a of the hall elements 12 and the pin-shaped terminals 14a of the connector pins 14 come close to the inclined guiding surfaces 22a, 22b respectively.

In this way, when the alignment plate 20 is completely mounted to the detection-side housing 5a, the throttle portions 21a and the throttle portions 21b respectively orient the ten pin-shaped terminals 12a and 14a to be parallel to each other and control the vertical and lateral positions of the distal ends of the terminals 12a and 14a properly. At the same time, the four retaining leg portions 20L (an example of pressing retaining members) come into contact with each upper surface of the two of the magnetic yoke members 13 and the two of the bias magnets 15 inserted in the first mounting process.

A third mounting process will be described below. As illustrated in FIG. 9, the PCB 18 is mounted from a downwardly direction to overlap the alignment plate 20 above the detection-side housing 5a. Positioning semicircular recessed portions 18b engaged with the side faces of the second pin-shaped mounting tools G2 are arranged at both sides of the PCB 18. Consequently, after the positioning recessed portions 18b are engaged with the ends of the two of the second pin-shaped mounting tools G2 respectively, the PCB 18 is moved downwardly. Accordingly, the ten pin-shaped terminals 12a, 14a sufficiently precisely arranged by the alignment plate 20 are naturally inserted into the ten mounting through-holes 18e, 18f of the PCB 18 simultaneously.

In addition, each of the mounting through-holes 18e formed on the PCB 18B for the hall elements 12 has an inner diameter smaller than the inner diameter at the lower end of each of the inclined guiding surface 22a and greater than the outer diameter of each of the throttle portions 21a. Likewise, each of the mounting through-holes 18f for the connector pins 14 has an inner diameter smaller than the inner diameter at the lower end of each of the inclined guiding surfaces 22b and greater than the outer diameter of the throttle portion 21b.

Figure 10A:
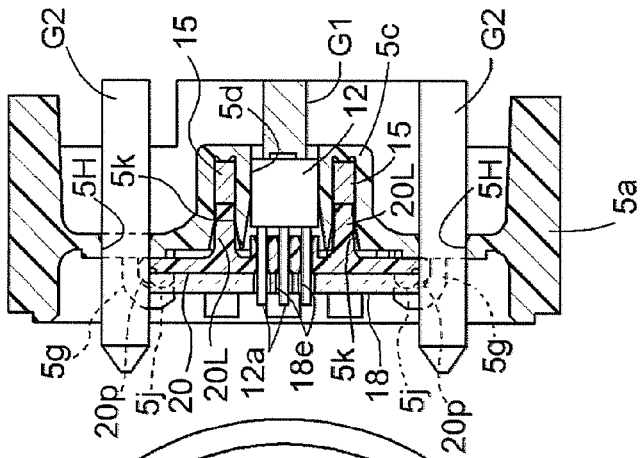
FIG. 10 is a trihedral figure illustrating a process for manufacturing the detection-side housing.
Figure 10B:
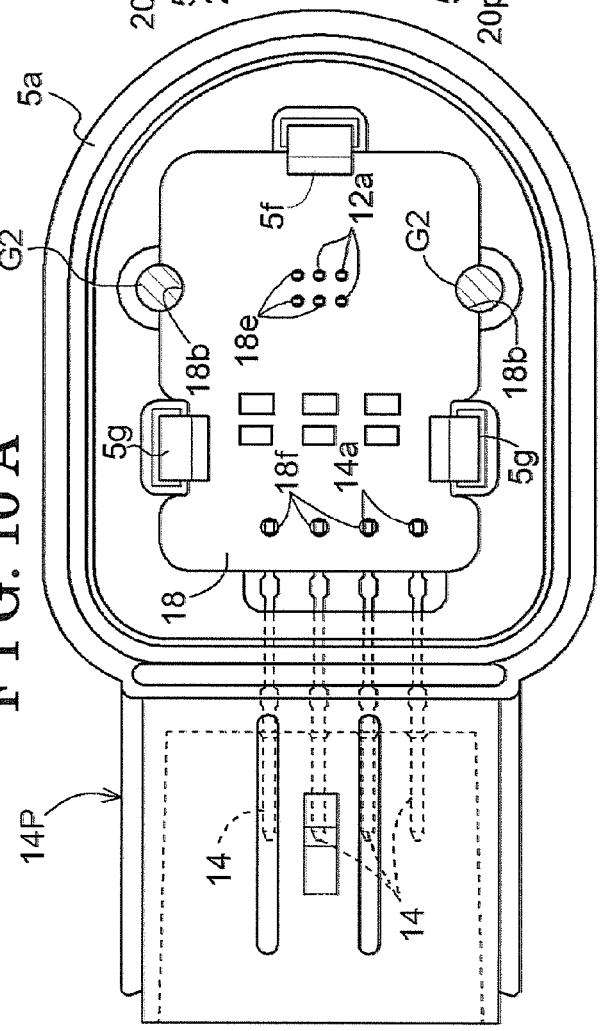
Figure 10C:
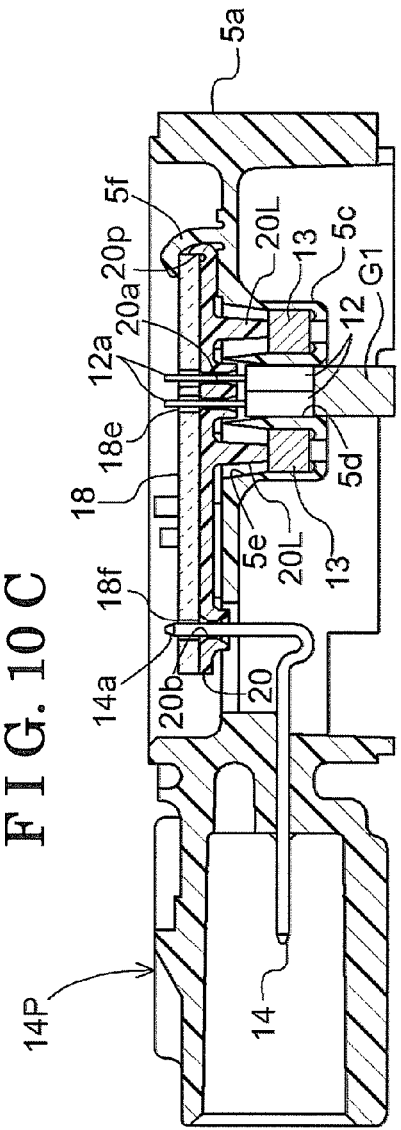

A fourth mounting process will be described below. As illustrated in FIG. 10, three thermal fixing portions 5f, 5g are formed at the detection-side housing 5a. PCB 18 and the alignment plate 20 are fixed to the detection-side housing 5a by thermally melting the thermal fixing portions 5f, 5g and thereby inclining the thermal fixing portions 5f, 5g toward the center of the PCB 18 while pressing the PCB 18 in a downwardly direction toward the detection-side housing 5a. A pair of welded protrusions 5j is disposed upright at the detection-side housing 5a. The welded protrusions 5j are respectively integrated partly with two of the thermal fixing portions 5g close to the connector portion 14P, by welding the two of the thermal fixing portions 5g and thereby inclining the thermal fixing portions 5g. When the PCB 18 and the alignment 20 are completely fixed to each other, the two of the magnetic yoke members 13 and the two of the biasing magnets 15 are pressed by the four retaining leg portions 20L against the bottom faces of the yoke storage recessed grooves 5e and the bias magnet storage grooves 5k respectively so as to be supported therein.

Protruding portions 20p are arranged at three corresponding positions on the outer periphery of the alignment plate 20 relative to the thermal fixing portions 5f, 5g in order to prevent the outer periphery of the alignment plate 20 from being damaged by the thermal fixing portions 5f, 5g. Furthermore, the protruding portions 20p protrude radially outwardly beyond the PCB 18. When the protruding portions 20p are cut down along a radially extending vertical plane, each of the cut down cross-section is formed into a fan-shape at the outer periphery of the lower surface of the alignment plate 20.

As illustrated in FIG. 6, positioning sections 20d are formed at the side faces of the alignment plate 20 besides the positioning recessed portions 20c engaged with the second pin-shaped mounting tools G2 respectively. In accordance with the mounting of the alignment plate 20 in the second process, the positioning sections 20d automatically and accurately position the alignment plate 20 relative to the detection-side housing 5a in a longitudinal direction (inserting direction in the opening of the connector 14P). The positioning sections 20d include engagement recessed portions 20e each thermally fixed and inclined so as to be engaged with the two of the thermal fixing portions 5g close to the connector portion 14P. The positioning sections 20d further include circular engagement bodies 20f each melted so as to be engaged externally with the welded portions 5j. The thermal fixing portions 5g close to the connector portion 14P are melted and thereby inclined in such a way to accommodate a part of the circular engagement bodies 20f respectively, thereby being integrated with the projecting portions 5j. In addition, the projecting portions 20p protrude radially outwardly beyond the circular engagement bodies 20f respectively.

A final mounting process (not shown in figures) will be explained below. The total of the ten pin-shaped terminals including the six pin-shaped terminals 14a and the four pin-shaped terminals are connected to each of corresponding solder pads of the PCB 18. Under this condition, a connecting method for melting solder by a laser beam is applied. Since the alignment plate 20 is made of black resin member containing a great amount of graphite particles, the alignment plate 20 is an approximate blackbody (which absorbs electromagnetic waves at any wavelength). Accordingly, even when the laser beam applied for connecting passes through through-holes or the like of the PCB 18, the alignment plate 20 located below the PCB 18 at least absorbs most of the wavelength of the laser beam, so that the hall elements 12 are not easily damaged by the laser beam.

The rotation angle detection device 4 described above is applied to the operating pedal unit 2 for a vehicle with a right-side-drive seat (hereinafter referred to the right-hand-drive vehicle). A structure for practicably sharing components of the rotation angle detection device 4 between the right-hand-drive and left-hand-drive vehicles will be described as follows.

As illustrated in FIG. 11, in the case where the bias magnets 15 are applied to the conventional rotation angle detection devices 4, 4' for the right-hand-drive and left-hand-drive vehicles, the structure of the detection-side housing 5a is the same but it is necessary to apply the sensor lever 8 having a different shape. In FIG. 11, a slotted hole 8H for inserting the end of the shaft 6 therein is arranged at the sensor lever 8. The position of the slotted hole 8H relative to the extending direction of the sensor lever 8 is identically different between the conventional rotation angle detection devices 4, 4' for the right-hand-drive vehicle and the left-hand-drive vehicle.

Figure 11A:
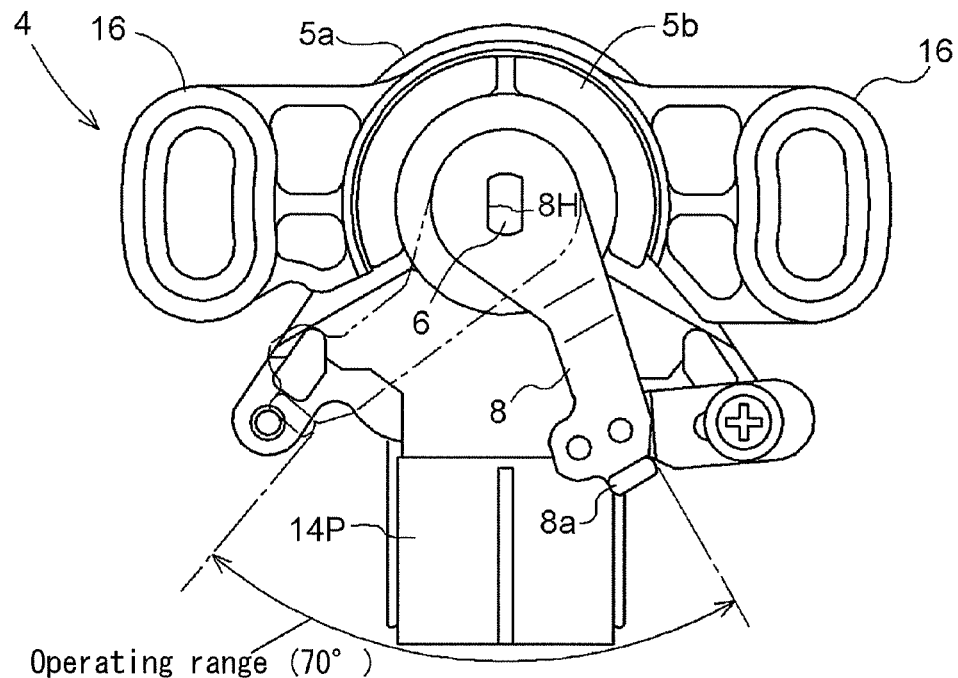
FIG. 11 is a lateral view illustrating a rotation angle detection device according to the conventional invention.

In the rotation angle detection device 4 for the right-hand-drive vehicle illustrated in FIG. 11A, the original point (at which the pedal arm 3 is not operated) of the rotational operation of the sensor lever 8 is located close to the right side and indicated by full lines. In response to a pedaling operation, the sensor lever 8 is rotatably operated in the left-hand direction from the original point to the maximum operative point within the rotational operating range of approximately 70 degrees indicated by chain double-dashed lines. Meanwhile, in the rotation angle detection device 4' for the left-hand-drive vehicle illustrated in FIG. 11B, the original point (at which the pedal arm 3 is not operated) of the rotational operation of the sensor lever 8 is located close to the left side and indicated by full lines. In response to a pedaling operation, the sensor lever 8 is rotatably operated into the right-hand direction from the original point to the maximum operative point within the rotational operating range of approximately 70 degrees indicated by chain double-dashed lines.

Figure 11B:
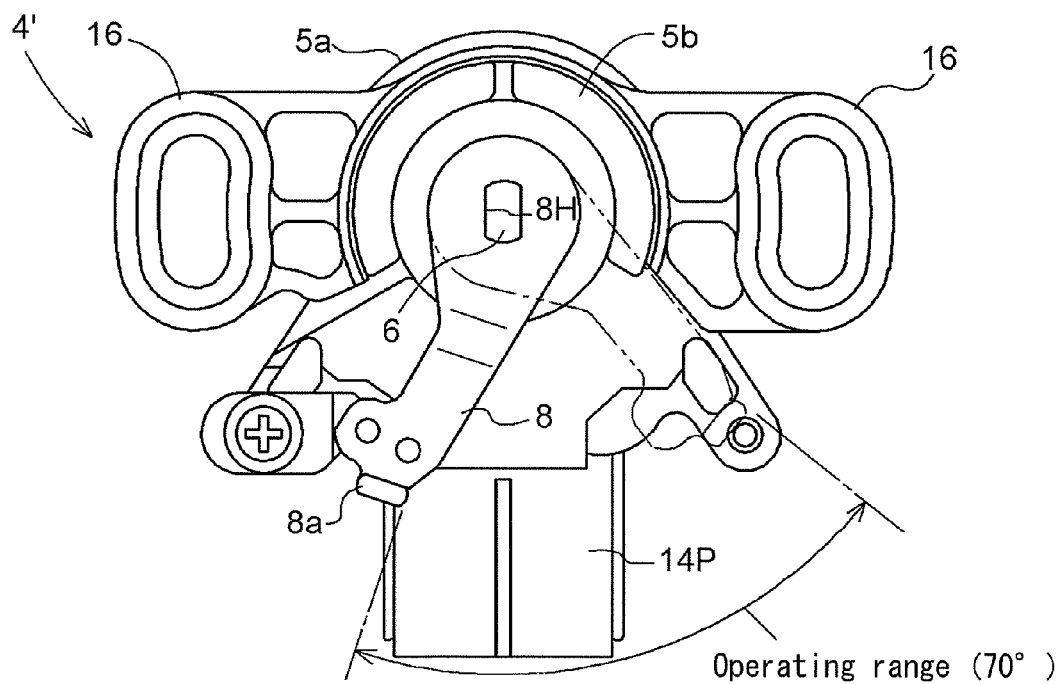

In order for the sensor lever 8 to detect operation angle precisely and within a wide range of approximately 70 degrees, the magnetic flux density affecting hall elements must be zeroed or minimized when the sensor lever is positioned at the original position for either the rotation angle detection device for right-hand-drive vehicle or the rotation angle detection device for left-hand-drive vehicle. Accordingly, as mentioned previously, although the original point of the sensor lever 8 is different between the rotation angle detection devices for the right-hand-drive vehicle and the left-hand-drive vehicle, it is necessary for the rotation phase of the rotor 7 to be the same when the sensor lever 8 is positioned at the original point. Consequently, as illustrated in FIGS. 11A and 11B, it is necessary to prepare the sensor lever 8 having the different-shaped slotted hole 8H for the rotation angle detection devices 4 for the right-hand-drive and for the rotation angle detection device 4' for the left-hand-drive vehicles.

As opposed to the above mentioned conventional rotation angle detection devices 4, 4', the rotation angle detection device 4' for the left-hand-drive vehicle illustrated in FIG. 3B has the same outer shape of the sensor lever 8 as the rotation angle detection device 4 for the right-hand-drive vehicle illustrated in FIG. 3A. Moreover, the same position of the slotted hole 8H relative to the extending direction of the sensor lever 8 is the same between the rotation angel detection devices 4, 4'. It is necessary for the magnetic flux density affecting the hall elements to be absolutely zeroed or minimized when the sensor lever 8 is positioned at the original point for either the rotation angle detection device 4 for the right-hand-drive vehicle or the rotation angle detection device 4' for the left-hand-drive vehicle. Accordingly, as is clearly understood by comparison between FIGS. 3A and 3B and between FIGS. 4 and 5, in the case of applying the same sensor lever 8 to the rotation angle detection devices for the right-hand-drive vehicle and the left-hand-drive vehicle, the different position of the slotted hole 8H and the different angular position of the rotor 7 are applied.

According to the embodiment, although the rotation phase of the rotor 7 is different between the rotation angle detection devices 4, 4' for the right-hand-drive and left-hand-drive vehicles when the sensor lever 8 is positioned at the original point, the magnetic flux density is zeroed or minimized when the sensor lever 8 is positioned at the original point for either the rotation angle detection device 4 or the rotation angle detection device 4'. Accordingly, either one of magnetizing directions of the bias magnets 15 and the rotor magnets 10 mounted in the rotation angle detection device 4' for the left-hand-drive vehicle, is oppositely directed from those of the rotation angle detection device 4 for the right-hand-drive vehicle. In particular, either one of the following two ways is applied.

Figure 5:
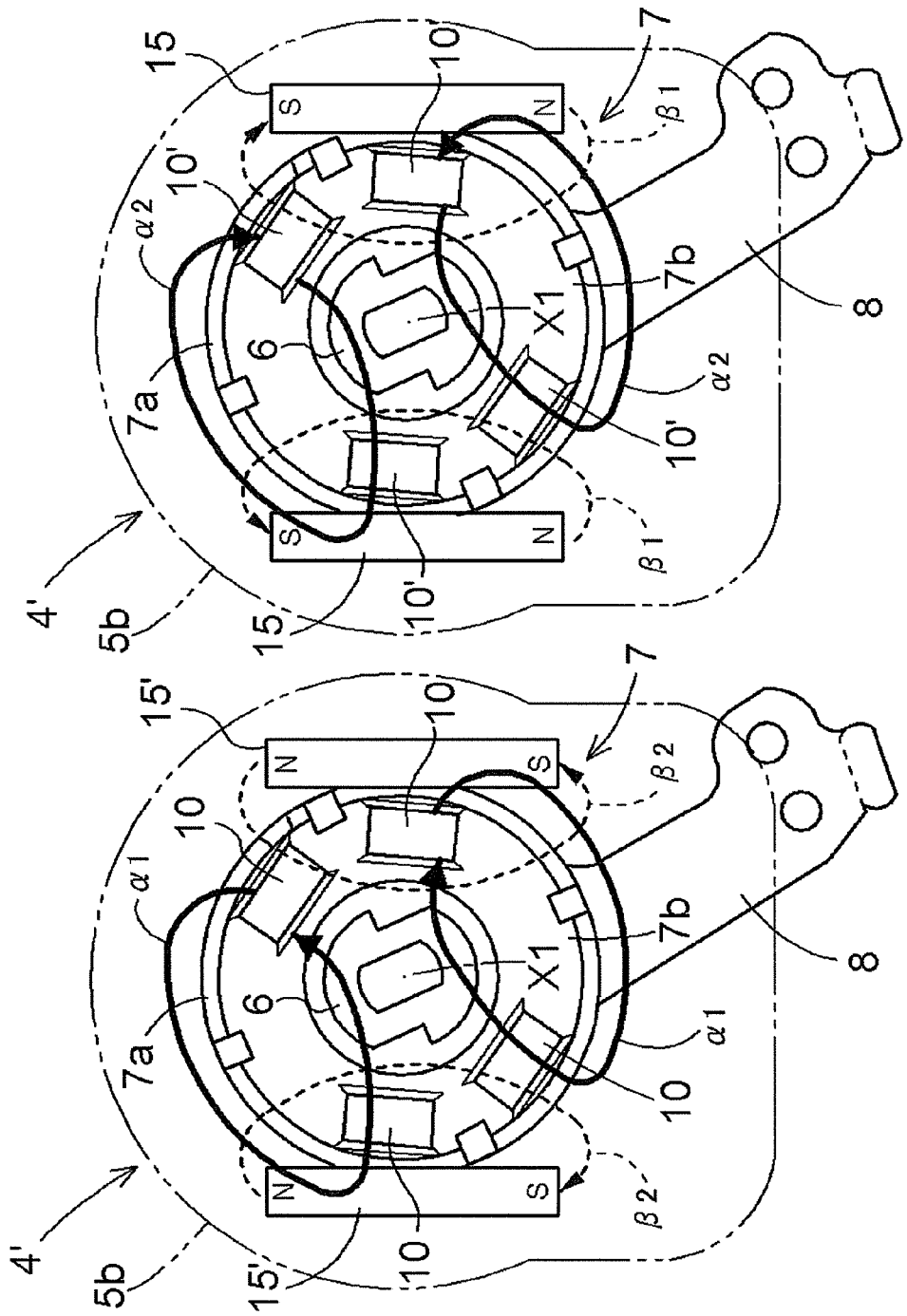
FIG. 5 is a schematic back view illustrating an internal portion of an operation-side housing (for a left-hand-drive vehicle)

In the rotation angle detection device 4' for the left-hand-drive vehicle illustrated in FIG. 5A, the rotation phase of the rotor 7 is different from that of the rotation angle detection device 4 for the right-hand-drive vehicle illustrated in FIG. 4. Accordingly, two magnetic fluxes α1, α1 being generated from the rotor magnets 10 have respectively a magnetic flux component heading in an upward direction illustrated in FIG. 5A, near the hall elements 12. However, magnetizing directions of bias magnets 15' are directed oppositely from those of the bias magnets 15 of the rotation angle detection device 4 for the right-hand-drive vehicle (FIG. 4). In other words, the rotation angle detection device 4' for the left-hand-drive vehicle includes the bias magnets 15' each having a north pole at its upper portion and a south pole at its lower portion. Moreover the bias magnets 15' include magnetic fluxes β2, β2 each having a magnetic flux component heading in a downward direction illustrated in FIG. 5. Accordingly, the upward magnetic flux component of the magnetic flux α1 is offset by the downward magnetic flux component of the magnetic flux β2.

In the rotation angle detection device 4' for the left-hand-drive vehicle illustrated in FIG. 5B, the rotation phase of the rotor 7 is different from that of the rotation angle detection device 4 illustrated in FIG. 4. However, magnetizing directions of rotor magnets 10' are directed oppositely from those of the rotor magnets 10 of the rotation angle detection device 4 for the right-hand-drive vehicle (FIG. 4). Accordingly, two magnetic fluxes α2, α2 being generated from rotor magnets 10' have respectively a magnetic flux component heading in a downward direction in FIG. 5B, near the hall elements 12. Consequently, the downward magnetic flux component of the magnetic flux α2 is offset by the upward magnetic flux component of the magnetic flux β1 included in the bias magnet 15 that is the same as the rotation angle detection device 4 for the right-hand-drive vehicle.

The mounting structure according to the embodiment may be modified as follows. The operation for mounting the alignment plate 20 and the PCB 18 to a housing is facilitated by applying the second pin-shaped mounting tools G2, furthermore facilitating the automated mounting of the alignment plate 20 and the PCB 18 to the housing. However, even when the second pin-shaped mounting tools G2 are not applied, pin-shaped terminals are easily inserted into through-holes of an alignment plate. Accordingly, after the alignment plate is mounted to the housing, the pin-shaped terminals are aligned, thereby significantly facilitating the mounting of the PCB 18 in the next process, which is advantageous.

In addition, the alignment plate 20 and the PCB 18 may be fixed to a housing with screws or by applying other fixing means not by welding thermal fixing portions and thereby inclining the thermal fixing portions to the housing.

When mounting is conducted by using the alignment plate 20, connector pins may not be necessarily included in other mounting components.

The mounting structure may be applied to a rotation angle detection device having no bias magnets.

The alignment plate 20 may not necessarily include the protruding portions 20p for protecting a PCB or retaining leg portions 20L for retaining compensating yokes.

Furthermore, the mounting structure according to the embodiment may be applied to a rotation angle detection device for detecting a rotation angle of a rotatably operated member. Other applicable mechanism for the rotation angle detection device according to the embodiment may not be limited to the operation pedal unit 2 for the vehicle taken as an example of the mechanism for rotatably operating the operated member.

As explained above, in the mounting structure according to the embodiment, even when one of the distal ends of the pin-shaped terminals 14a is dislocated from the original alignment position, it is possible to easily mount the alignment plate 20 to the detection-side housing 5a by inserting the distal ends of the pin-shaped terminals 14a into the through-holes 21b since the inclined guiding surface is formed continuously with the through-hole 21b of the alignment plate 20 for guiding the distal end of the pin-shaped terminal 14a into the through-hole 21b. Once the alignment plate 20 is mounted to the detection-side housing 5a, the through-holes 21b position all of the pin-liked terminals 14a in the original alignment positions, so that the PCB 18 is easily mounted to the detection-side housing 5a by inserting the pin-shaped terminals 14a into the small mounting through-holes 18f on the PCB 18 in the next mounting process. Consequently, for example, an automated mounting is achieved by applying a simple structure and inexpensive mounting tools.

According to the mounting structure of the embodiment, the alignment plate 20 includes the positioning recessed portion 20c engaged with the second pin-shaped mounting tool G2 arranged upright at the detection-side housing 5a and thereby positioning the alignment plate 20 relative to the PCB 18.

Accordingly, the automated mounting is easily achieved by the mounting structure described above.

According to the mounting structure of the embodiment, the electronic component 12 includes the hall element 12, and the alignment plate 20 includes the retaining leg portion 20L, for retaining the magnetic yoke member 13 for compensating the magnetic flux to the detection-side housing 5a.

Accordingly, the alignment plate 20 further serves as a fixing means for fixing the magnetic yoke member 13 to the detection-side housing 5a, therefore reducing the number of an apparatus including the electronic component 12.

According to the mounting structure of the embodiment, the PCB 18 and the alignment plate 20 are fixed to the detection-side housing 5a with the thermal fixing portion 5f/5g formed on the detection-side housing 5a by thermally melting the thermal fixing portion 5f/5g and thereby inclining the thermal fixing portion 5f/5g. Furthermore, in the mounting structure, the PCB 18 includes the protruding portion 20p arranged at a corresponding position of the alignment plate 20 relative to the thermal fixing portion 5f/5g and protruding radially outwardly beyond the PCB 18.

Accordingly, the thermal fixing portion 5g/5f is prevented from being damaged against the PCB 18.

According to the mounting structure of the embodiment, the detection-side housing 5a is provided with the connector pin 14 electrically connected to the electronic component 12, the PCB 18 is provided with the mounting through-hole 18f, and the through-hole 21b includes the throttle portion 21b extending along the inserting direction of the pin-shaped terminal 14a.

Accordingly, not only the electronic component 12 and similar electronic components but also the connector pin 14 electrically connected with the electronic components 12 are mounted to the detection-side housing 5a at the same time.

According to the mounting structure of the embodiment, the alignment plate 20 is made of a resin member including carbon for forming an approximate blackbody.

For example, the ten pin-shaped terminal 14*a* is connected to a solder pad of the PCB 18 by applying a laser beam. In this case, even when a part of the laser beam passes through the mounting through-hole 18*f* of the PCB 18, the alignment plate 20 forming an approximate blackbody and located below the PCB 18, at least absorbs most of the wavelength of the laser beam. Consequently, electronic components such as the hall elements 12 are not easily damaged by the laser beam.

According to the mounting structure of the embodiment, the pin-shaped terminal 14*a* of the connector pin 14 is a plurality of pin-shaped terminals, and the hall element 12 is a plurality of hall elements.

According to the mounting structure of the embodiment, the pin-shaped terminal 14*a* is inserted into the through-hole 21*b* so as to be oriented in an appropriate direction and to be placed at an appropriate position without being inclined.

The principles, preferred embodiment and mode of operation of the present invention have been described in the foregoing specification. However, the invention, which is intended to be protected, is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A mounting structure comprising:
a housing;
an electronic component mounted at the housing;
a pin-shaped terminal arranged upright at the housing;
a circuit board having a mounting through-hole into which the pin-shaped terminal is inserted;
a mounting support member positioned between the housing and the circuit board and fixed to the housing with the circuit board, the mounting support member including a through-hole for positioning the pin-shaped terminal and an inclined guiding surface formed continuously with the through-hole for guiding a distal end of the pin-shaped terminal into the through-hole;
the mounting support member includes a positioning portion engaged with a mounting tool and arranged upright at the housing and thereby positioning the mounting support member relative to the printed board; and
wherein the pin-shaped terminal of the connector pin is a plurality of pin-shaped terminals, and the electronic component is a plurality of hall elements.

2. The mounting structure according to claim 1, wherein the electronic component includes a hall element, and the mounting support member includes a retaining portion for retaining a yoke member for compensating the magnetic flux to the housing.

3. The mounting structure according to claim 2, wherein the circuit board and the mounting support member are fixed to the housing with a thermal fixing portion formed on the housing by thermally melting the thermal fixing portion and thereby inclining the thermal fixing portion, and the circuit board includes a protruding portion arranged at a corresponding position of the mounting support member relative to the thermal fixing portion and protruding radially outwardly beyond the circuit board.

4. The mounting structure according to claim 3, wherein the housing is provided with a connector pin electrically connected to the electronic component, the circuit board is provided with the mounting through-hole, and the through-hole includes a throttle portion extending along the inserting direction of the pin-shaped terminal.

5. The mounting structure according to claim 2, wherein the housing is provided with a connector pin electrically connected to the electronic component, the circuit board is provided with the mounting through-hole, and the through-hole includes a throttle portion extending along the inserting direction of the pin-shaped terminal.

6. The mounting structure according to claim 1, wherein the circuit board and the mounting support member are fixed to the housing with a thermal fixing portion formed on the housing by thermally melting the thermal fixing portion and thereby inclining the thermal fixing portion, and the circuit board includes a protruding portion arranged at a corresponding position of the mounting support member relative to the thermal fixing portion and protruding radially outwardly beyond the circuit board.

7. The mounting structure according to claim 6, wherein the housing is provided with a connector pin electrically connected to the electronic component, the circuit board is provided with the mounting through-hole, and the through-hole includes a throttle portion extending along the inserting direction of the pin-shaped terminal.

8. The mounting structure according to claim 1, wherein the housing is provided with a connector pin electrically connected to the electronic component, the circuit board is provided with the mounting through-hole, and the through-hole includes a throttle portion extending along the inserting direction of the pin-shaped terminal.

9. The mounting structure according to claim 1, wherein the mounting support member is made of a resin member including carbon for forming an approximate blackbody.

10. A mounting structure comprising:
a housing;
an electronic component mounted at the housing;
a pin-shaped terminal arranged upright at the housing;
a circuit board having a mounting through-hole into which the pin-shaped terminal is inserted;
a mounting support member positioned between the housing and the circuit board and fixed to the housing with the circuit board, the mounting support member including a through-hole for positioning the pin-shaped terminal and an inclined guiding surface formed continuously with the through-hole for guiding a distal end of the pin-shaped terminal into the through-hole; and
wherein the circuit board and the mounting support member are fixed to the housing with a thermal fixing portion formed on the housing by thermally melting the thermal fixing portion and thereby inclining the thermal fixing portion, and the circuit board includes a protruding portion arranged at a corresponding position of the mounting support member relative to the thermal fixing portion and protruding radially outwardly beyond the circuit board.

11. The mounting structure according to claim 10, wherein the housing is provided with a connector pin electrically connected to the electronic component, the circuit board is provided with the mounting through-hole, and the through-hole includes a throttle portion extending along the inserting direction of the pin-shaped terminal.

12. The mounting structure comprising:
a housing;
an electronic component mounted at the housing;
a pin-shaped terminal arranged upright at the housing;
a circuit board having a mounting through-hole into which the pin-shaped terminal is inserted;

a mounting support member positioned between the housing and the circuit board and fixed to the housing with the circuit board, the mounting support member including a through-hole for positioning the pin-shaped terminal and an inclined guiding surface formed continuously with the through-hole for guiding a distal end of the pin-shaped terminal into the through-hole; and wherein the electronic component includes a hall element, and the mounting support member includes a retaining portion for retaining a yoke member for compensating the magnetic flux to the housing.

13. The mounting structure according to claim 12, wherein the mounting support member includes a positioning portion engaged with a mounting tool and arranged upright at the housing and thereby positioning the mounting support member relative to the printed board.

14. The mounting structure according to claim 13, wherein the pin-shaped terminal of the connector pin is a plurality of pin-shaped terminals, and the hall element is a plurality of hall elements.

15. The mounting structure according to claim 12, wherein the circuit board and the mounting support member are fixed to the housing with a thermal fixing portion formed on the housing by thermally melting the thermal fixing portion and thereby inclining the thermal fixing portion, and the circuit board includes a protruding portion arranged at a corresponding position of the mounting support member relative to the thermal fixing portion and protruding radially outwardly beyond the circuit board.

16. The mounting structure according to claim 15, wherein the housing is provided with a connector pin electrically connected to the electronic component, the circuit board is provided with the mounting through-hole, and the through-hole includes a throttle portion extending along the inserting direction of the pin-shaped terminal.

17. The mounting structure according to claim 12, wherein the housing is provided with a connector pin electrically connected to the electronic component, the circuit board is provided with the mounting through-hole, and the through-hole includes a throttle portion extending along the inserting direction of the pin-shaped terminal.

18. The mounting structure according to claim 12, wherein the housing is provided with a connector pin electrically connected to the electronic component, the circuit board is provided with the mounting through-hole, and the through-hole includes a throttle portion extending along the inserting direction of the pin-shaped terminal.

19. The mounting structure according to claim 12, wherein the mounting support member is made of a resin member including carbon for forming an approximate blackbody.

20. The mounting structure according to claim 12, wherein the pin-shaped terminal is inserted into the through-hole so as to be oriented in an appropriate direction and to be placed at an appropriate position without being inclined.

* * * * *